United States Patent
Mertol et al.

[11] Patent Number: 6,114,761
[45] Date of Patent: Sep. 5, 2000

[54] THERMALLY-ENHANCED FLIP CHIP IC PACKAGE WITH EXTRUDED HEATSPREADER

[75] Inventors: Atila Mertol, Cupertino; Zeki Z. Celik, Sunnyvale; Farshad Ghahghahi, Los Gatos; Zafer S. Kutlu, Sunnyvale, all of Calif.

[73] Assignee: LSI Logic Corporation, Milpitas, Calif.

[21] Appl. No.: 09/009,580

[22] Filed: Jan. 20, 1998

[51] Int. Cl.[7] .............. H01L 23/34; H01L 23/10; H01L 23/48
[52] U.S. Cl. .............. 257/722; 257/712; 257/778; 257/706
[58] Field of Search ............... 257/722, 675, 257/704, 706, 778, 796, 712, 713, 714, 717–720, 725, 730–733; 361/703, 704, 687, 697

[56] References Cited

U.S. PATENT DOCUMENTS

| | | | |
|---|---|---|---|
| 4,092,697 | 5/1978 | Spaight | 361/386 |
| 5,223,747 | 6/1993 | Tschulena | 257/713 |
| 5,276,584 | 1/1994 | Collins et al. | 361/718 |
| 5,359,768 | 11/1994 | Haley | 29/840 |
| 5,559,674 | 9/1996 | Katsu | 361/697 |
| 5,625,229 | 4/1997 | Kojima et al. | 257/712 |
| 5,650,662 | 7/1997 | Edwards et al. | 257/700 |
| 5,705,850 | 1/1998 | Ahiwake et al. | 257/714 |

FOREIGN PATENT DOCUMENTS

| | | | |
|---|---|---|---|
| 4-259246 | 9/1992 | Japan | 257/722 |
| 5-74987 | 3/1993 | Japan | 257/722 |

*Primary Examiner*—Mahshid Saadat
*Assistant Examiner*—Jhihan B. Clark

[57] ABSTRACT

A thermally-enhanced flip chip integrated circuit (IC) package has a package substrate to which an IC die is bonded. A thermally-conductive heatspreader, having planar dimensions larger than the IC die, is thermally bonded at or near its center to an upper surface of the IC die. A plurality of cooling extensions are formed that protrude from a lower surface (the surface closest to the package substrate) of the heatspreader so as to create passageways through which cooling air may flow. In one embodiment, the cooling extensions are parallel fins that protrude transversely from the lower surface of the heatspreader, thereby forming U-shaped channels. In another embodiment, the cooling extensions are an array of fin pins that protrude transversely from the lower surface of the heatspreader.

10 Claims, 3 Drawing Sheets

THERMALLY-ENHANCED FLIP CHIP IC PACKAGE WITH EXTRUDED HEATSPREADER

BACKGROUND OF THE INVENTION

The present invention relates to integrated circuit (IC) packages, and more particularly to a flip chip IC package having an extruded heatspreader that offers more surface area for heat dissipation, as well as a flat surface for an external heatsink attachment, and hence provides the flip chip IC package with enhanced thermal dissipation characteristics.

In the last few decades, the electronics industry has literally transformed. the world. Electronic products are used by, or affect the daily lives of, a large segment of the world's population. For example, telephones, television, radios, Personal Computers (PCs), laptop PCs, palmtop PCs, PCs with built-in portable phones, cellular phones, wireless phones, pagers, modems, and video camcorders, are just a few of the electronic products that have been developed in recent years and which have been made smaller and more compact, while providing more and/or enhanced functions than ever before. The integrated circuit (IC) chip, and the more efficient packaging of the IC chip, have played a key role in the success of these products.

In just the last couple of years, application-specific integrated circuit (ASIC) technology has evolved at a rapid pace. Advantageously, higher clock rates, higher gate counts, cell-based designs and better design tools have converged to enable the creation of complete, high-performance systems on a single IC chip.

The evolution of ASIC technology has mandated new requirements and challenges for IC packaging technology. That is, increasing clock rates make package electrical characteristics more significant in the determination of system performance. Higher gate counts enable the creation of high power, core-limited designs that usually require better and more efficient thermally-enhanced packages. Lastly, increasing system input-output (I/O) requirements mandate packages that support higher lead counts and provide better board assembly yields.

One of the IC packaging approaches that has recently evolved to help meet the challenges of ASIC technology is the IC flip chip package. A sectional view of a conventional IC flip chip package is shown in FIG. 1A. As seen in FIG. 1A, an IC flip chip package 10 typically includes a substrate 16 having an upper surface 11a and a lower surface 11b. An IC die 18 is bonded in or near the center of the upper surface 11a. The IC die, as is known in the art, is formed and cut from a silicon wafer which has been processed so as to include desired electronic circuit components, e.g., transistors, diodes, signal traces interconnecting the transistors, etc. An array of bonding pads is also formed within the die, typically around the periphery of the die, to provide a way to make electrical contact with the electrical circuitry formed in the die.

In many IC packages (not flip chip packages), wire bonds are used to connect each of the IC die bonding pads to a corresponding trace, lead, or pin on a substrate or chip carrier. However, a characterizing feature of a flip chip package is that the die 18 is "flipped over" from its usual IC-die-bonding-pads-up position (to facilitate attachment of a wire bond) to an IC-die-bonding-pads-down position so that the IC die bonding pads face towards the upper surface of the substrate 16. Solder bumps 20 are attached to the I/O pads on the die. Each solder bump 20 is designed to electrically and mechanically bond with a respective solder-bump pad on the upper surface 11a of the package substrate 16. The solder-bump pads, in turn, are then connected through a network of signal traces and vias located on and within the substrate 16 to a corresponding array of solder balls 22 located on the lower surface 11b of the substrate 16. The solder balls 22 may then be soldered to corresponding array of landing pads (not shown) on a printed wiring board (PWB) when the IC package 10 is mounted on the PWB, which PWB forms part of a desired electronic system.

As needed, a metal stiffener 14 may be attached to the upper surface 11a of the package substrate 16. A heatspreader 12 may also be attached to the stiffener 14 by use of an adhesive 28. An advantage of using a flip chip package, such as the package 10 shown in FIG. 1A, is that the flipped-over upper surface is flat and has no circuitry components thereon, thereby providing a good surface to which the heatspreader 12 may be thermally bonded. In addition, flip chip ICs provide more I/O connections than do wire bond ICs due to the use of the full surface area of the IC chip. The heat spreader 12, and stiffener 14, when used, add rigidity to the package and allow heat generated by power consumption within the IC to be dissipated. Removing heat in an IC device is critically important in order to maintain the junction temperature of the various semiconductor junctions used within the IC to within allowable junction temperature limits for reliable operation and long life of the IC. For high power devices, an external heat sink may be attached to the heatspreader 12, as needed.

Still with reference to FIG. 1A, it is common practice, when employing a heatspreader 12, to employ a flat heatspreader that is attached to the package stiffener 14 by a suitable layer of epoxy 28. Unfortunately, the layer of epoxy 28 used to bond the heatspreader 12 to the package stiffener 14 impedes the thermal conduction path to the stiffener.

Disadvantageously, even when dissipated heat is allowed to efficiently reach the heatspreader, only the upper flat surface of the heatspreader 12 is generally exposed or "open" to surrounding ambient air, and thus available for efficiently radiating or convecting heat away from the IC package. (Some heat may also be transferred through the stiffener to the substrate and be dissipated through the substrate to the printed wiring board [PWB] on which the IC package is mounted.) The ability of the heatspreader to dissipate heat thus becomes a function of the available paths for heat dissipation coupled to the heatspreader, and such paths are, in large part, dictated by the open or exposed surface area of the heatspreader in combination with the amount or flow of ambient air that comes in contact with the exposed surface. For high power devices, an external heat sink may be attached to the exposed surface of the heatspreader, thereby effectively increasing the exposed surface area over which heat may be dissipated. For even higher power devices, a blower or fan may be used to further increase the amount of air flow that comes in contact with the exposed surface. But, even external heat sinks and blowers do not allow the lower surface of the heatspreader to efficiently dissipate heat. What is needed, therefore, is a flip chip IC package design that effectively exposes both the upper and lower surfaces of the heatspreader, thereby allowing more heat to be efficiently dissipated through the heatspreader.

Further, because the use of external heat sinks and/or fans or blowers represent additional components that increase the cost of a system employing such components, there is a need in the art for a flip chip IC package design wherein the heatspreader is capable of dissipating more heat than has heretofore been possible, thereby eliminating the need for external heat sinks and/or blowers for all but the very high power applications.

SUMMARY OF THE INVENTION

The present invention addresses the above and other needs by providing a thermally-enhanced flip chip integrated circuit (IC) package that efficiently uses both sides of a heatspreader to dissipate heat. Moreover, such IC package significantly increases the available surface area on the lower surface of the heatspreader available for heat dissipation, thereby effectively eliminating the need to use expensive external heat sinks and fans/blowers for all but the very high power applications.

The thermally enhanced IC package of the present invention includes a package substrate on which an IC die is bonded in conventional flip chip manner. A thermally-conductive extruded heatspreader, having planar dimensions larger than the IC die, is then thermally bonded at or near its center to an upper flat surface of the IC die. Unlike heatspreaders of the prior art, however, the extruded heatspreader of the present invention includes a plurality of cooling channels formed on its lower surface (the surface closest to the package substrate) on opposing lateral sides of the extruded heatspreader, thereby allowing heat to be more effectively conducted away from the IC die through the lower surface of the heatspreader.

In accordance with one aspect of the invention, the cooling channels comprise inverted U-shaped channels formed by parallel fins that protrude transversely from the lower surface of the heatspreader. Such fins typically have a height less than the thickness of the IC die to facilitate the flow of air thereunder. However, for some applications, the fins may have a thickness greater than the thickness of the IC die so that a longitudinal edge of the fin contacts the upper surface of the substrate, thereby effectively forming O-shaped channels through which cooling air may pass.

In accordance with another embodiment of the invention, pin fins protrude transversely from the lower surface of the heatspreader, thereby allowing cooling air to readily pass inbetween and around such fins.

It is a feature of the present invention to provide a thermally-enhanced flip chip IC package wherein heat may be more efficiency conducted away from the IC die housed within the IC package without the need for additional external heatsinks and/or fans and blowers. It is an additional feature of the invention, however, to provide such a thermally-enhanced flip chip IC package that is also amenable to the use of an external heat sink and/or fans and blowers when the power dissipation requirements of the IC chip warrant such use.

It is another feature of the invention to provide a flip chip IC package having an extruded heatspreader therein wherein at least portions of both the upper surface and lower surface of the heatspreader are exposed to ambient air for the efficient dissipation of heat.

It is still another feature of the invention to provide a flip chip IC package having an extruded heatspreader wherein the effective surface area of the lower surface of the heatspreader is increased beyond the surface area that would normally be available by the planar dimensions of the heatspreader. More particularly, it is a feature of the invention, in accordance with one embodiment thereof, to provide an extruded heatspreader having parallel fins that protrude from the bottom surface thereof, which fins increase the available exposed surface area of the lower surface. In accordance with another embodiment, it is a feature of the invention to provide an array of pin fins that protrude from the bottom surface of the extruded heatspreader, thereby also increasing the available exposed surface area of the lower surface.

It is a further feature of the invention to provide a flip chip IC package having an extruded heatspreader wherein cooling channels are formed along the lower surface of the heatspreader, which cooling channels thus augment the heat dissipation capabilities of the IC package.

BRIEF DESCRIPTION OF THE DRAWINGS

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

Figure 1A:
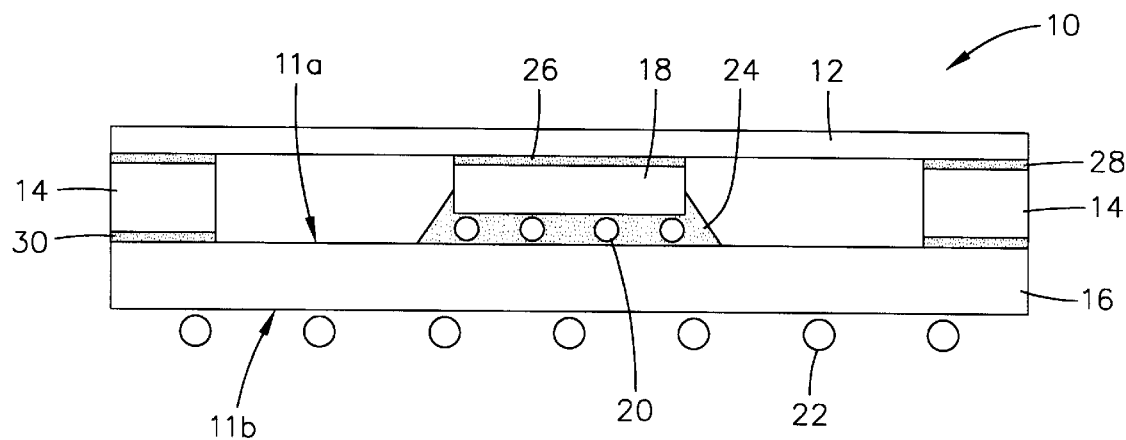
FIG. 1A is sectional view of one embodiment of a conventional flip chip package utilizing a separate heatspreader and stiffener.

FIG. 1A shows a sectional view of one embodiment of a conventional flip chip package 10 utilizing a separate heatspreader 12 and stiffener 14. This figure is described in the Background portion of this application. As previously described, a substrate 16 has an IC die 18 mounted thereto. For the embodiment shown in FIG. 1A, the die 18 is electrically attached to the substrate 16 via solder bumps 20 located on the die 18. The solder bumps 20 are connected to solder-bump pads, which are connected to signal traces and/or vias, on an upper surface of the substrate 16, which signal traces and vias respectively connect with individual solder balls 22 located within an array of solder balls on the underneath side 11b of the substrate 16. An underfill epoxy 24, such as Hysol 4527, or other suitable bonding agent, may also be used between the die 18 and the upper surface 11a of the substrate 16 in order to further mechanically attach the IC die 18 to the substrate 16.

Still referring to FIG. 1A, the heatspreader 12 is thermally coupled to the upper surface of the die 18 via a thin layer 26 of a suitable die attach compound, such as AbleStick 965-1L or QMI 505, or equivalent material. The stiffener 14, when used, is attached to the underside periphery of the heatspreader 12 by means of a heatspreader attach epoxy 28. The other side of the stiffener 14 is similarly attached to the upper surface of the substrate by means of a suitable stiffener attach epoxy 30, which also may be AbleStick 965-1L, QMI 505, or an equivalent substance.

The IC package 10 shown in FIG. 1A is of conventional design, and conventional techniques, well known in the art, may be used to fabricate and assemble the package and the components used within the package.

Figure 1B:
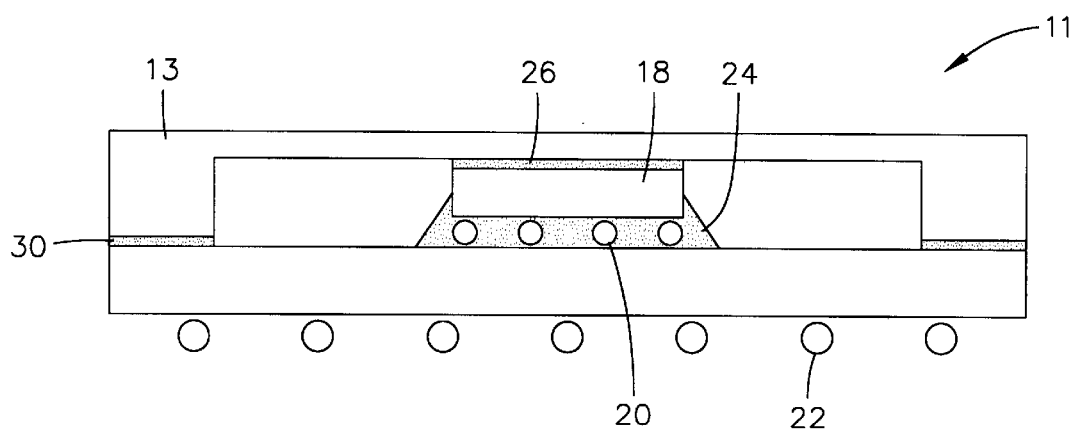
FIG. 1B is a sectional view of another embodiment of a flip chip package utilizing an integral heatspreader/stiffener.

To improve the thermal performance of the IC package 10 shown in FIG. 1A, the heatspreader and stiffener may be combined into a single integrated heatspreader/stiffener component, thereby eliminating the epoxy layer previously required between the separate heatspreader and stiffener components, as shown in FIG. 1B. Because epoxy exhibits low thermal conductivity (i.e., is a poor conductor of heat), it impedes heat dissipation from the IC die. Thus, by eliminating the epoxy layer, the thermal conduction path from the die to the heatspreader is significantly enhanced, thereby allowing more heat to be more efficiently removed from the IC die. FIG. 1B thus shows a sectional view of a flip chip package 11 utilizing an integral heatspreader/stiffener 13, rather than a separate heatspreader 12 and stiffener 14 as is shown in FIG. 1A. A variation of this type of integral component, e.g., one that includes an integral heatspreader and stiffener and heatsink is described in copending U.S. patent application Ser. No. 09/009,576, filed concurrently herewith (Attorney Docket Number 57963), assigned to the same assignee as the present application, which copending application is incorporated herein by reference.

Figure 2A:
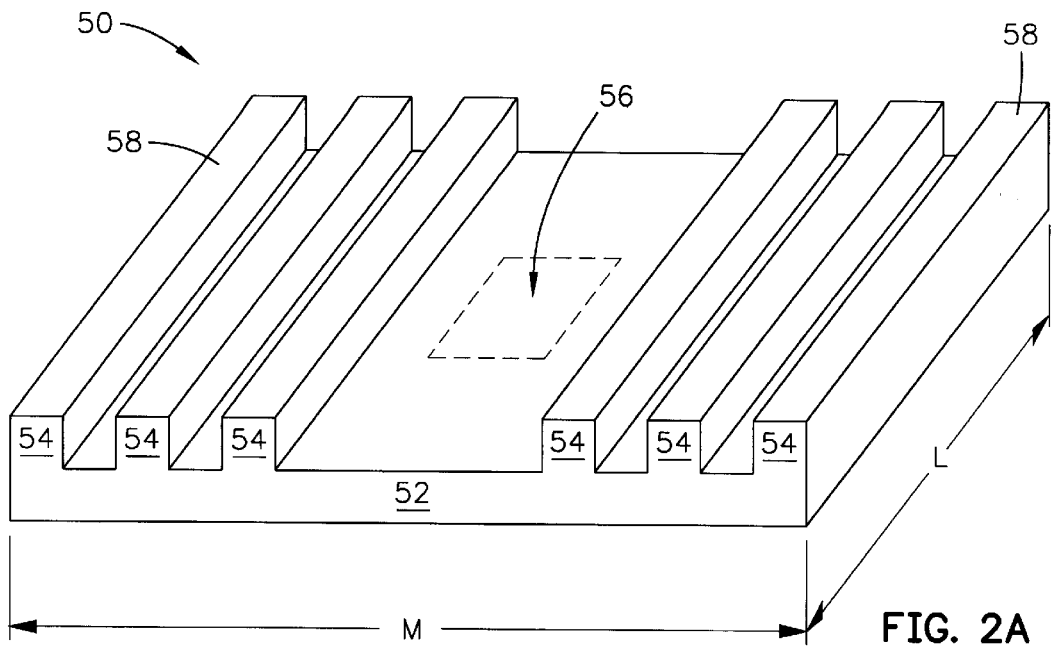
FIG. 2A shows an inverted view of an extruded heatspreader made in accordance with one embodiment of the invention that provides parallel fins protruding from a lower surface of the heatspreader.
Figure 2B:
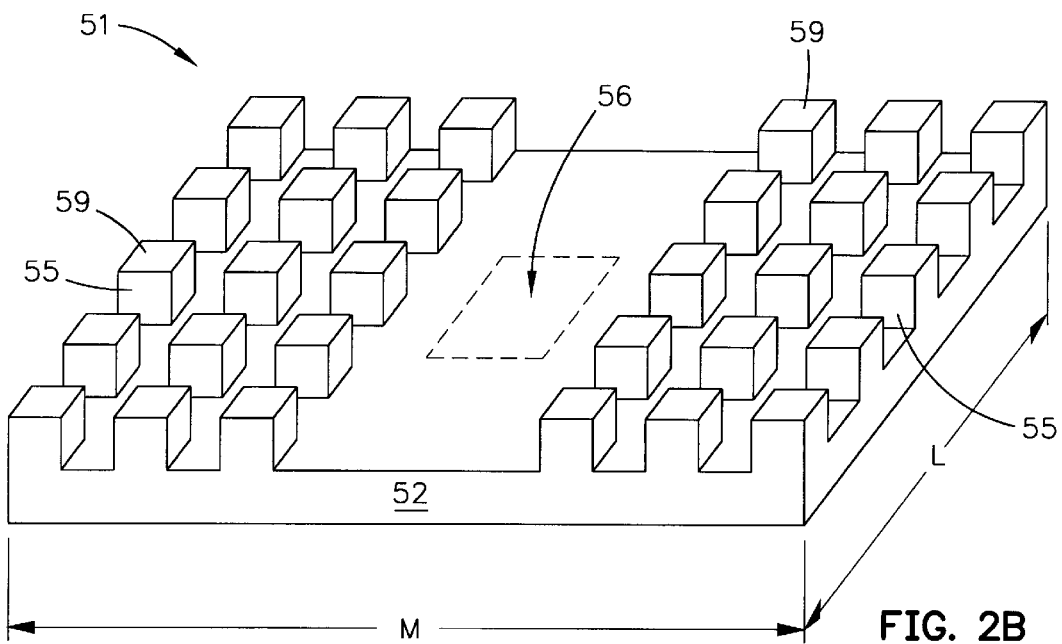
FIG. 2B shows an inverted view of an extruded and cut heatspreader made in accordance with another embodiment of the invention that provides an array of pin fins protruding from the lower surface of the heatspreader.
Figure 3:
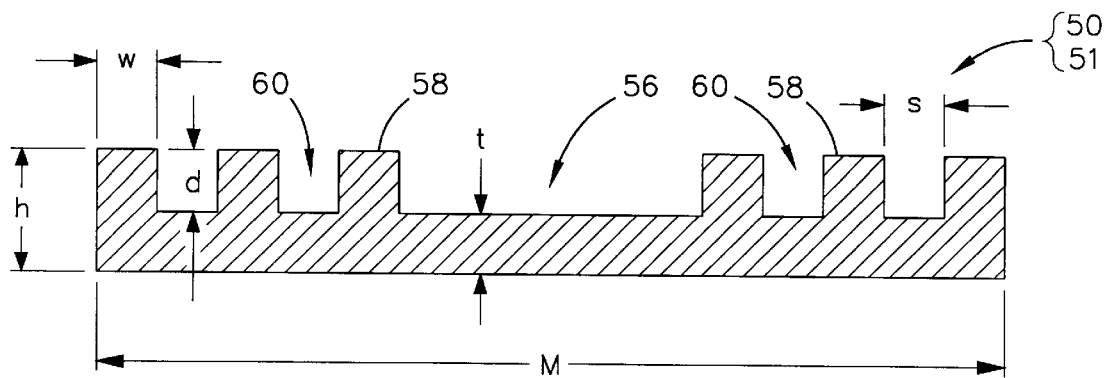
FIG. 3 is a sectional view of the extruded heatspreader of FIG. 2A or 2B.
Figure 4:
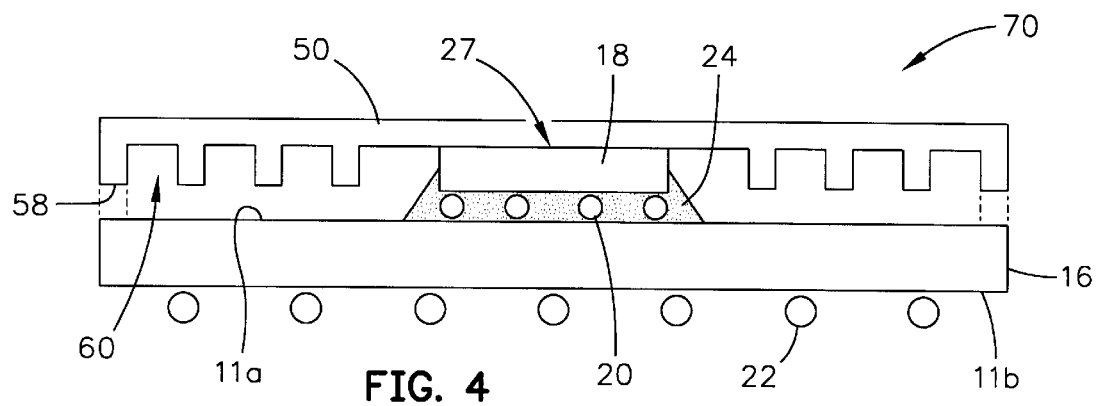
FIG. 4 shows a sectional view of a flip chip package that incorporates the extruded heatspreader of FIG. 3.
Figure 5:
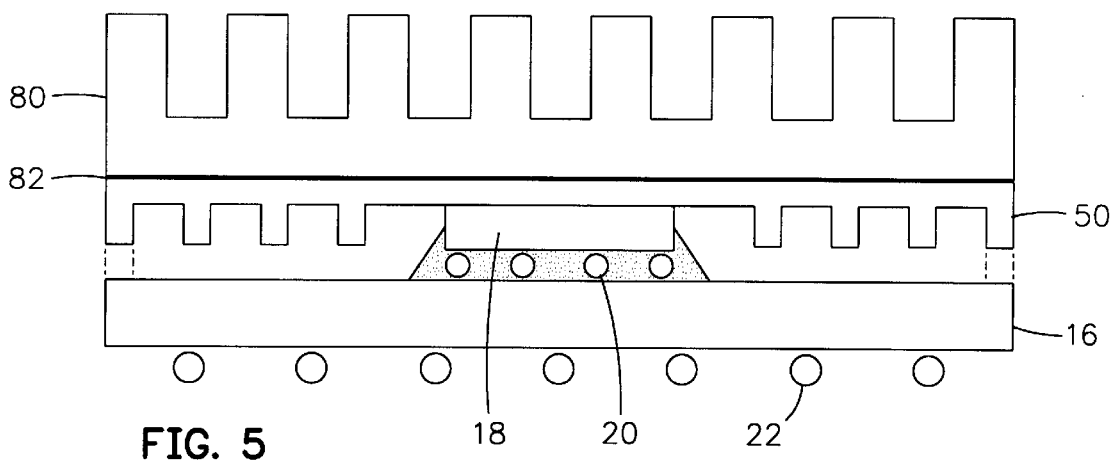
FIG. 5 illustrates a sectional view of a flip chip package that incorporates the extruded heatspreader of FIG. 3 and that further includes an external heat sink.

Referring next to FIGS. 2A, 2B and 3, there is shown perspective views and a sectional view, respectively, of two different types of extruded heatspreaders made in accordance with the present invention. A first embodiment, shown in FIG. 2A, provides an extruded heatspreader 50 that includes a plurality of parallel fins 54 that protrude transversely from a planar base portion 52. A second embodiment, shown in FIG. 2B, provides an extruded and cut heatspreader 51 that includes an array of pin fins 55 that protrude from the planar base portion 52. The pin fins can also be populated around the periphery by leaving a flat surface in the middle for die attachment. The extruded heatspreader 50 of FIG. 2A, and the extruded and cut heatspreader 51 of FIG. 2B, as shown in these figures, is oriented to be up-side-down from how it is positioned in the other figures (FIGS. 4 and 5, discussed below.) It is noted that FIG. 3 shows a sectional view that applies to either the parallel fin embodiment 50 of FIG. 2A or to the pin fin embodiment 51 of FIG. 2B (when the section is taken through the pin fins 55).

As seen in FIGS. 2A, 2B and 3, the extruded heatspreader 50 includes a planar base portion 52 having dimensions of "L" by "M". For the embodiment shown in FIG. 2A, a plurality of parallel fins 54 protrude transversely from the planar base portion 52. Each of the fins 54 runs the entire length "L" of the base portion. An equal number of fins 54 is located on each lateral side of the planar base portion 52. That is, by way of example, three fins are shown in FIG. 2A on each lateral side of the heatspreader 50. For the embodiment shown in FIG. 2B, an array of pin fins 55 protrude transversely from the planar base portion 52. An equal number of pin fins resides on each lateral side of the heatspreader 51.

For the fin embodiment of FIG. 2A, each fin 54 has a longitudinal ridge portion 58. The region between adjacent fins forms a U-shaped channel 60. For the pin fin embodiment of FIG. 2B, each pin fin 55 has a tip portion 59. The region between adjacent pin fins forms a U-shaped opening. As defined in FIG. 3, each fin 54, or each pin fin 55, has a width "w", and a depth "d". The spacing between adjacent fins or pins is a distance "s". The thickness of the planar base portion 52 is a distance "t"; and the total height of the base portion and fin or pin fin is a distance "h", where h=t+d. Typical ranges for these parameters are as follows: t=0.3 to 0.5 mm; d=0.3 to 0.8 mm; s=0.3 to 0.5 mm; w=0.3 to 0.5 mm.

Typically, for most flip chip IC packages made in accordance with the present invention, the planar dimensions of the extruded heatspreader 50, M by L, are approximately the same as the planar dimensions of the substrate 16 on which the IC die 18 is to be mounted.

The heatspreader 50 should be made from a good thermal conductive material, such as copper or aluminum, or alloys thereof. The heatspreader 50 (FIG. 2A) is preferably made as a one-piece component using a conventional extrusion process. The heatspreader 51 (FIG. 2B) is also preferably made as a one-piece component using an extrusion process followed by a cross-cutting process (to cut out portions of the fins so as to create the pins).

As will be described more fully below in connection with FIG. 4, a central portion 56 of the heatspreader 50 or 51 represents the preferred area to which the upper surface of the IC die 18 is thermally bonded when assembling an IC package in accordance with the present invention.

Once the heatspreader 50 or 51 has been extruded or otherwise formed to have the desired dimensions, a flip chip IC package 70 is formed as illustrated in FIG. 4. As seen in FIG. 4, a flip chip IC die 18 is mounted on an upper surface 11a of a substrate 16 via an array of solder bumps 20 located on the die which match and mount to corresponding solder-bump pads on the upper surface of the substrate 16. Solder balls 22, located on a lower surface of the substrate 16 are interconnected with the solder-bump pads and solder bumps 20 in conventional manner. A suitable underfill material 24 is used to further bond the die 18 to the substrate 16, as is known in the art.

In accordance with the present invention, the extruded heatspreader 50 or 51 is thermally and mechanically bonded to the upper surface of the IC die 18. Typically, such bonding is achieved using a die attach layer of thermally-conductive epoxy 27, such as AbleStick 965-1L or QMI 505.

In one embodiment, the fins 54 of the heatspreader 50 have a height "d" such that the ridge portion 58 does not contact the upper surface 11a of the substrate 16. This allows an opening along the lateral edge of the fins through which air may freely flow.

In another embodiment, one or more of the fins 54 on each lateral side of the die 18 are extended so as to have a height "d" such that the ridge portion 58 does contact the upper surface 11a of the substrate 16, as shown, e.g., by the dotted lines in FIG. 4 for the two outer-most fins of the heatspreader 70. This ridge-portion-to-surface contact adds a degree of rigidity to the package 70 similar to that provided by a stiffener. While air may not circulate under the ridge portions of the extended fins in this embodiment, air can still flow longitudinally through the channels 60.

The embodiment of the pin fin heatspreader 51 shown in FIG. 2B may similarly have the height "d" of the individual pin fins 55 selected to reach the upper surface 11a of the substrate 16 or not, as desired. In either event, air may circulate freely in and around the pin fins through the open space inbetween the pin fins.

The present invention advantageously allows the underneath side of the heatspreader 70 (the side closest to the upper surface 11a of the substrate 16) to be exposed to ambient cooling air, and thus to dissipate heat away from the heatspreader. This additional exposed surface area of the heatspreader is in addition to the area (M by L) already exposed on the upper surface of the heatspreader 50. Thus, the capacity of the heatspreader 50 to dissipate heat away from the IC die 18, and thus to keep the operating temperature of the IC die 18 to within acceptable limits, is greatly enhanced.

In approximate terms, and with reference to the extruded heatspreader 50 shown in FIG. 2A, the additional surface area made available on the lower surface of the heatspreader 50 is at least as great as the exposed surface area on the upper surface of the heatspreader. The upper surface area is M×L. The lower surface area is M×L, less the area 56, but plus the additional surface area provided by each fin. Each fin adds surface area equal to 2dL. Thus, depending upon the number and dimensions of fins employed, the overall surface area made available through the extruded heatspreader of the present invention, in a flip chip package of the type shown in FIG. 4, may increase by a factor of at least two, or more, over the heatspreader surface area provided by a conventional flip chip package of the type shown in FIG. 1A. Such increased surface area allows the heatspreader to perform its function of dissipating heat much more efficiently.

An advantage of the flip chip package 70 made in accordance with the present invention is that it may also be used with an external heat sink 80, if necessary. That is, as illustrated in FIG. 5, for those applications requiring an IC die that must operate in a high power consumption mode, the flip chip package 70 may be further enhanced through the addition of a conventional external heatsink 80. Such heatsink 80 is thermally bonded to the upper surface of the extruded heatspreader 50 by a layer 82 of thermally conductive epoxy or tape, such as QMI 505, Kapton tape, or an equivalent substance.

As described above, it is thus seen that the present invention provides a thermally-enhanced flip chip IC package wherein heat may be efficiency conducted away from the IC die without the need for additional external heatsinks and/or fans and blowers. However, it is further seen that the flip chip IC package provided by the invention is amenable to the use of an external heat sink and/or fans and blowers when the power dissipation requirements of the IC chip warrant such use.

It is also seen that the invention provides a flip chip IC package wherein at least portions of both the upper surface and lower surface of an extruded stiffener/heatspreader are exposed to ambient air for the efficient dissipation of heat.

It is further seen that the invention provides a flip chip IC package wherein the effective surface area of the lower surface of the heatspreader is increased through the use of parallel fins that protrude from the bottom surface thereof, which fins increase the available exposed surface area of the lower surface.

Additionally, it is seen that the invention provides a flip chip IC package wherein cooling channels are formed along the lower surface of an extruded heatspreader, which cooling channels thus augment the heat dissipation capabilities of the IC package.

While the invention herein disclosed has been described by means of specific embodiments and applications thereof, numerous modifications and variations could be made thereto by those skilled in the art without departing from the scope of the invention set forth in the claims.

What is claimed is:

1. A thermally-enhanced integrated circuit (IC) flip chip package comprising:
   a package substrate;
   an integrated circuit (IC) die having an upper and lower surface, the IC die being electrically and mechanically attached to the package substrate at its lower surface; and
   an extruded heatspreader having an upper flat and lower extruded surface, a central portion of the lower extruded surface being thermally attached to the upper surface of the IC die, the lower extruded surface having a surface area larger than the upper surface of the IC die, whereby the extruded heatspreader extends beyond the IC die to form an overhang, the overhang having cooling extensions protruding therefrom into an airspace allowing convective cooling.

2. The IC flip chip package of claim 1 wherein the cooling extensions comprise an array of pin fins.

3. The IC flip chip package of claim 1 wherein the cooling extensions comprise fins protruding downwardly from the lower extruded surface towards the package substrate on opposite sides of the IC die, said fins forming an integral part of the extruded heatspreader.

4. The IC flip chip package of claim 1 wherein the cooling extensions increase the surface area of the lower extruded surface over what the surface area of the lower extruded surface would otherwise be without the cooling extensions by a factor of at least two.

5. The IC flip chip package of claim 1 wherein the upper flat surface has an upper surface area that has approximately same planar dimensions as the package substrate.

6. The IC flip chip package of claim 1 further including an external heatsink thermally bonded to the upper flat surface.

7. The IC flip chip package of claim 3 wherein the downwardly-protruding fins lie in parallel planes that are transverse to the lower extruded surface.

8. The IC flip chip package of claim 7 wherein there are at least two downwardly-protruding partitions on each lateral side of the IC die.

9. The IC flip chip package of claim 6 wherein the external heatsink has a plurality of upwardly extending fins.

10. A thermally-enhanced flip chip integrated circuit (IC) package having a package substrate to which an IC die is bonded, a heatspreader thermally bonded on its lower extruded surface to an upper surface of the IC die and mechanically bonded to the package substrate, wherein the improvement comprises:
    an extruded heatspreader made from a thermally conductive material; and
    a plurality of cooling extensions formed on opposing lateral sides of the extruded heatspreader so as to reside on the lower flat surface.

* * * * *